(12) United States Patent
Acharya et al.

(10) Patent No.: US 6,731,567 B2
(45) Date of Patent: May 4, 2004

(54) DDR MEMORY AND STORAGE METHOD

(75) Inventors: Pramod Acharya, Munich (DE);
Stefan Dietrich, Turkenfeld (DE);
Sabine Kieser, Hausham (DE); Peter Schroegmeier, Munich (DE)

(73) Assignee: Infineon Technologies, AG, Munich (DE)

(*) Notice: Subject to any disclaimer, the term of this patent is extended or adjusted under 35 U.S.C. 154(b) by 0 days.

(21) Appl. No.: 10/350,482

(22) Filed: Jan. 24, 2003

(65) Prior Publication Data

US 2003/0151971 A1 Aug. 14, 2003

(30) Foreign Application Priority Data

Jan. 31, 2002 (DE) .......................................... 102 03 893

(51) Int. Cl.⁷ ................................................ G11C 8/00
(52) U.S. Cl. ...................................... 365/233; 365/236
(58) Field of Search ............................ 365/189.05, 194, 365/220, 221, 230.06, 233, 236, 230.03

(56) References Cited

U.S. PATENT DOCUMENTS 6,128,244 A * 10/2000 Thompson et al. .......... 365/233
6,317,372 B1    11/2001 Hayashi et al. ............. 365/233
6,337,830 B1 *  1/2002 Faue ........................... 365/233
6,442,644 B1 *  8/2002 Gustavson et al. .......... 365/194
6,510,099 B1 *  1/2003 Wilcox et al. ............ 365/189.05
6,539,454 B2 *  3/2003 Mes ............................ 365/233

* cited by examiner

*Primary Examiner*—Trong Phan
(74) *Attorney, Agent, or Firm*—Jenkins, Wilson & Taylor, P.A.

(57) ABSTRACT

The invention relates to a DDR memory and to a storage method for storing data in a DDR memory having a plurality of memory cells which each have a prescribed word length, in which a serial data input is used to read in serial data on a rising or falling edge of the data clock signal, and a serial-parallel converter is used to put together a prescribed number of data items from the data read in to give a prescribed number of words from data words having the prescribed word length.

To make transferring the data from one synchronization area to another synchronization area, and resynchronization thereof, more reliable, the invention involves an interface memory copying the at least one data word from the serial-parallel converter upon receipt of a copy signal which is synchronous with the data block signal and outputting it to a bus upon receipt of an output signal which is synchronous with the system clock signal.

5 Claims, 3 Drawing Sheets

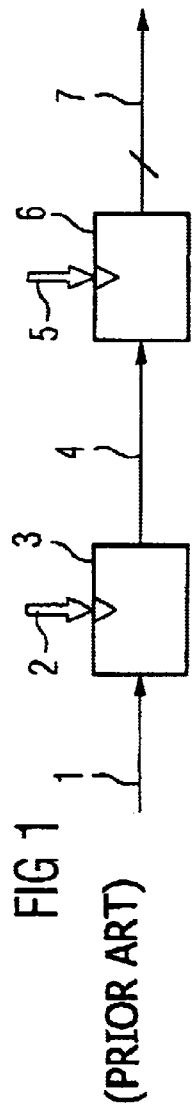
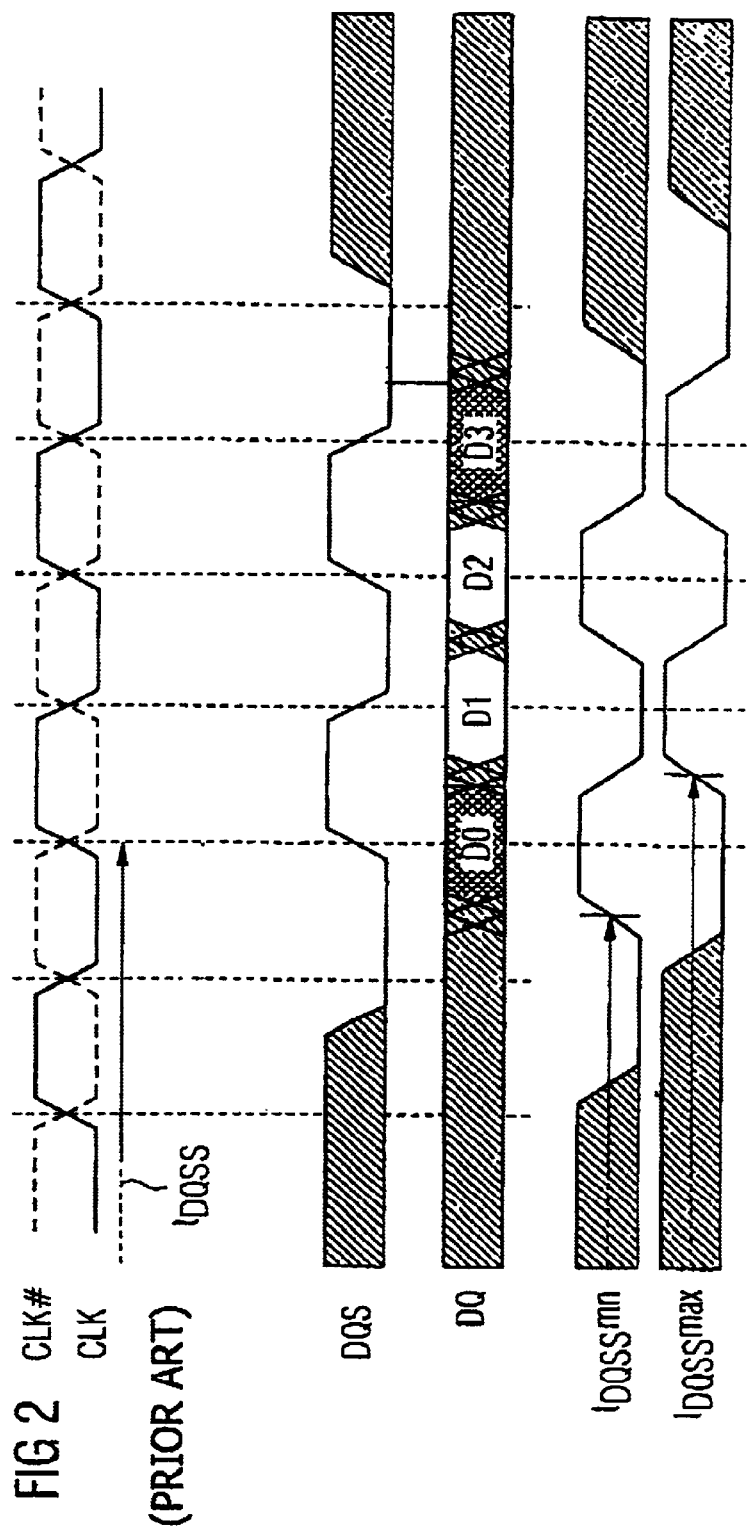
FIG 1 (PRIOR ART)
FIG 2 (PRIOR ART)

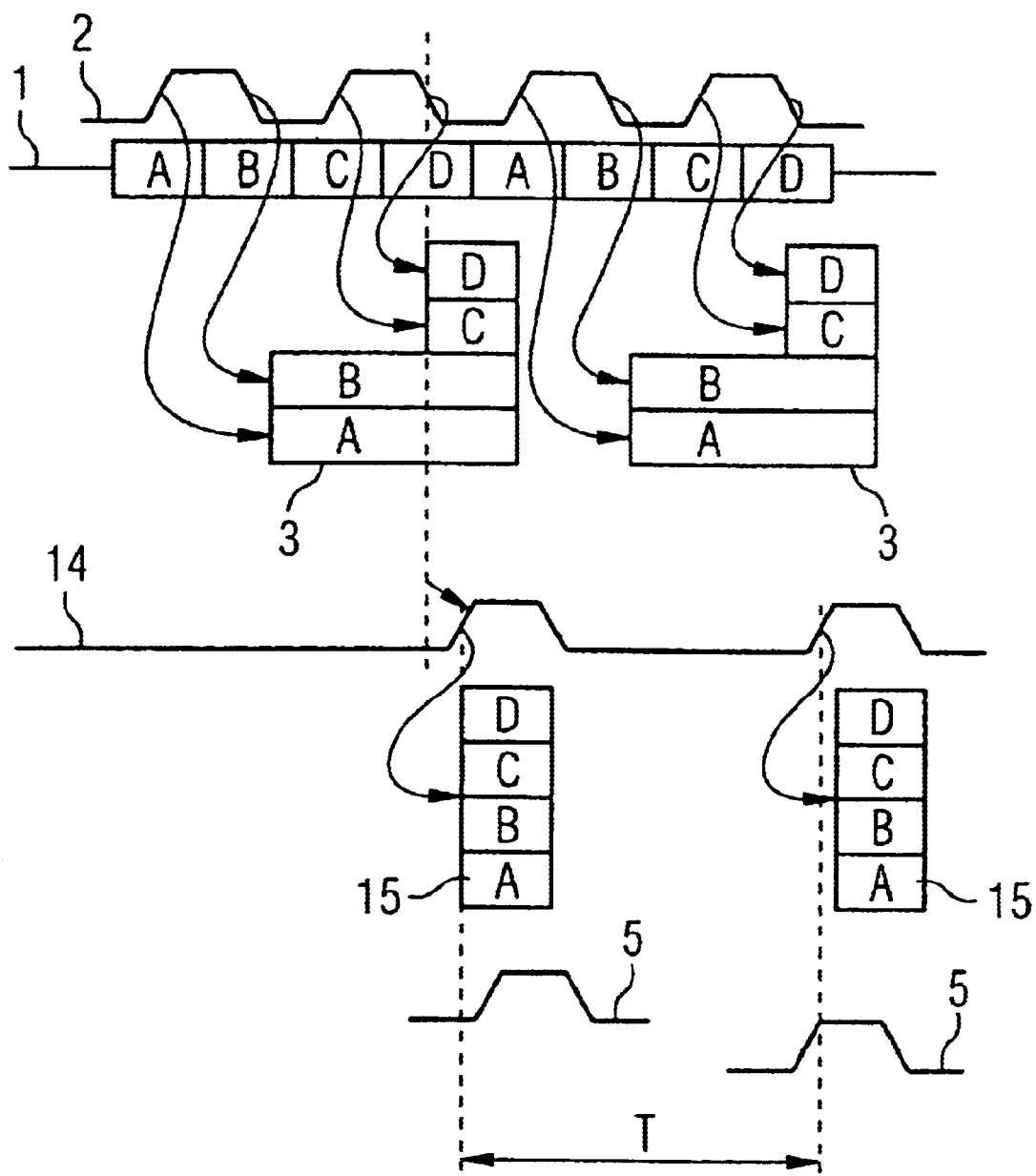

DDR MEMORY AND STORAGE METHOD

TECHNICAL FIELD

The invention relates to a DDR memory and to a storage method in such a DDR memory in accordance with the precharacterizing part of claim 1 or 4, and particularly to stabilization of write access operations.

BACKGROUND ART

Whereas read and write operations in normal memories take place only on the rising or falling edge of a clock signal, data in DDR (double data rate) memories are read and written both on rising edges and on falling edges of the clock signal, i.e. at double the data rate. In this case, the clock signal used for reading in the data differs from the clock signal used for transferring instructions. During write access to the memory, the data (DQ) are delivered by a controller together with a write clock signal (data strobe clock, DQS) in order to ensure a fixed temporal relationship between data and the write clock signal DQS. The write instruction is synchronized with an instruction clock CLK.

The phase of the write clock signal DQS (and hence of the data) can fluctuate relative to an external clock signal for addresses and commands (CLK), specifically to the extent of a shift forward or back through one quarter of a clock cycle. For the write part of the data path in the memory, this means that the data are not read in and synchronized with the internal clock signal derived from the external clock signal CLK, but rather with the write clock signal DQS. However, external access to the memory array, including address decoding, is derived from the respective write command WR and from an address information item ADR. The write command WR and the address information item ADR are for their part synchronized with the external clock signal CLK. The result of this is that the write path needs to contain an interface between signals which are synchronized with the write clock signal DQS and signals which are synchronized with the clock signal CLK for addresses and commands. The transition between the two synchronization domains is called a "clock-domain change". Specifically, the data at the input of DDR memories are synchronized with the write clock signal DQS and are subsequently written synchronously to a memory-internal data bus in a further circuit using an external write clock signal WRCLK.

If the write clock signal DQS and the external write clock signal WRCLK do not observe particular specifications, data can be inadvertently overwritten when transferring between the DQS and CLK areas. The reliability of data transfer between the DQS and CLK areas is dependent on the maximum shift in the external write clock signal WRCLK with respect to the clock signal CLK and hence also with respect to the write clock signal DQS.

SUMMARY OF THE INVENTION

It is an object of the invention to make the transfer of data from one synchronization area to another synchronization area, and resynchronization thereof, more reliable.

The invention achieves this object by means of the DDR memory in accordance with claim 1 and by the storage method in accordance with claim 4. Preferred embodiments of the invention are covered by the subclaims.

By introducing a pulsed interface between the DQS-synchronous and the CLK-synchronous area, the write clock signal DQS is shifted with respect to the external write clock signal WRCLK, so that relatively long intervals of time arise between the two. It is possible to double the interval. This makes time for receiving the data in the subsequent synchronization area, and data transfer becomes more reliable.

The inventive DDR memory having a plurality of memory cells which each have a prescribed word length, which comprises: a first clock signal input for receiving a system clock signal, a second clock signal input for receiving a data clock signal, an instruction input for reading in and decoding a write instruction which is synchronized with the system clock signal, a serial data input for reading in serial data on a rising edge and on a falling edge of the data clock signal, a serial-parallel converter for putting together a prescribed number of data items from the data read in to give a prescribed number of words from data words having a prescribed word length, is characterized by an interface memory which copies the at least one data word from the serial-parallel converter when it receives a copy signal which is synchronous with the data clock signal, and which outputs the at least one data word to a bus when it receives an output signal which is synchronous with the system clock signal.

In particular, the invention provides a device for producing a time window in which production of the copy signal is inhibited by the data clock.

In one preferred embodiment of the invention, the device for producing a time window comprises a counter, whose output state changes once from a first to a second output state between the reading-in of a first data value and of a last data value for the at least one data word, and a clock synchronization device which outputs the copy signal when a data clock signal is applied and the counter has the second output state.

The inventive storage method for storing data in a DDR memory, as described above, having a plurality of memory cells which each have a prescribed word length is characterized by an interface memory copying the at least one data word from the serial-parallel converter upon receipt of a copy signal which is synchronized with the data clock signal and outputting the at least one data word to a bus upon receipt of an output signal which is synchronous with the system clock signal.

One advantage of the invention is that the pulsed interface memory extends the maximum possible tolerance for production-related and operation-related fluctuations (voltage, temperature), so that demands on other circuits can be reduced.

Other features and advantages of the invention can be found in the description below of an exemplary embodiment, where reference is made to the appended drawings.

BRIEF DESCRIPTION OF THE DRAWINGS

FIG. 1 schematically shows a memory interface based on the prior art.

FIG. 2 shows a timing diagram for the clock and data signals on the memory interface shown in FIG. 1.

FIG. 5 is an illustration to explain the time gain on the memory interface shown in FIG. 4.

DETAILED DESCRIPTION OF THE INVENTION

FIG. 1 schematically shows the design of a memory interface in a DDR memory. The data to be written arrive at the memory via a serial data line 1. Simultaneously with the data, a data clock signal 2 is applied. The two signals are captured by a data read-in device 3, the design of which will be explained in detail later. The data are forwarded via an internal data line 4.

The data clock fluctuates with respect to the system clock within a specified range. A write instruction applied to the memory externally is processed in the memory synchronously with an instruction clock, which for its part is synchronous with the system clock. The instruction clock is applied, on a line 5, to a resynchronization device 6 which reads in the data on the internal data line 4. In the resynchronization device 6, the data are synchronized with the instruction clock or with the system clock, and they are then output to an internal parallel data bus 7 which generally has the same width as the individual memory cells (not shown) of the memory.

The data are resynchronized to the system clock using a series of signals shown in detail in FIG. 2. The data DQ arrive on the line 1. Two data values are shown as cross-hatched areas, namely a first data value D0 and a final data value D3. In between, there may be further data items in a transmission, for example D1 and D2 etc. Simultaneously with the data, the memory receives the signal DQS via the line 2. This signal DQS fluctuates overtime with respect to the system clock signal CLK and the negated system clock signal CLK#. The only data to be read in which are recognized are those which have a particular temporal relationship $t_{DQSS}$ with the data clock DQS, that is to say the data values D0 to D3 in the illustration. The boundaries within which the temporal relationship between the data and the data clock needs to fall is shown in the bottom two signal profiles: the very bottom profile indicates the maximum shift $t_{DQSS}$max in the clock signal with respect to the data signal for long times, and the profile above gives the minimum shift $t_{DQSS}$mn.

Hatched areas of the signals in FIG. 2 are not taken into account.

Figure 3:
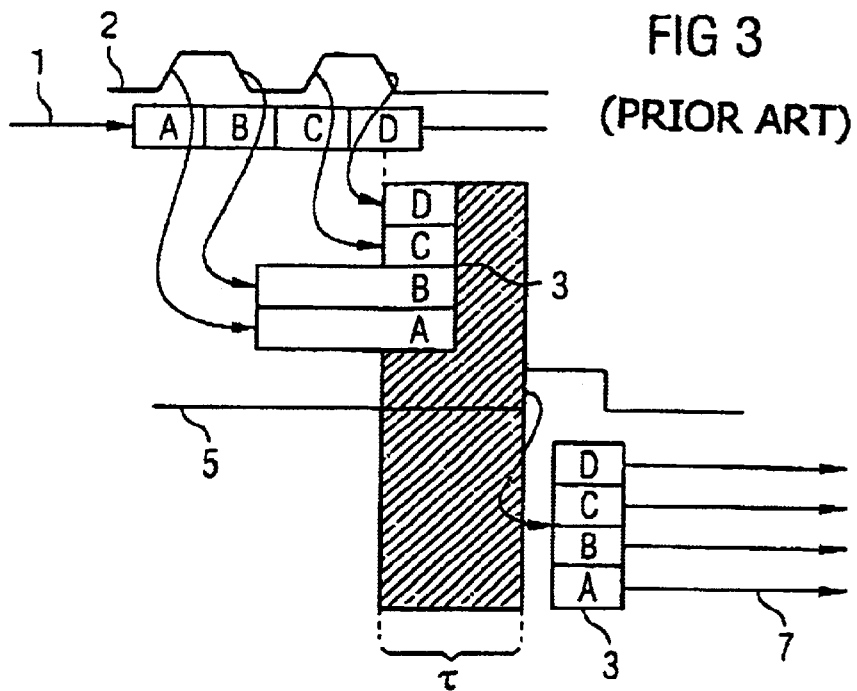
FIG. 3 shows the sequence of data transfer operations based on the prior art.

Reading in the arriving data and buffer-storing them in the interface in the prior art is shown in FIG. 3. In this case, it is assumed that the data values A, B, C and D, forming a cohesive data packet or "burst ", arrive on the data input line 1. The associated data clock signal pulses on line 2 are shown above. On the first rising edge of the data clock signal, the value A is stored in a register in the data read-in device 3. On the subsequent falling edge of the data clock signal 2, the value B is stored in a second register in the data read-in device 3. On the second rising edge of the data clock signal 2, the value C is stored in a third register, and on the second falling edge of the data clock signal 2, the value D is stored in a fourth register.

As soon as all the values of a "burst" have been read in and stored, the prior art involves a data word, whose length corresponds to the number of data values stored, being output via the internal parallel bus 7. The output of the data on the bus 7 is prompted by the system-clock-synchronous signal on the line 5. As already described above, the time τ between completion of storage in the registers and output of the data to the parallel bus 7 can therefore be very short, so short that data which have already been applied from a subsequent "burst" have already overwritten the first value (in this case A) in one of the registers, and hence the write operation proceeds incorrectly.

Figure 4:
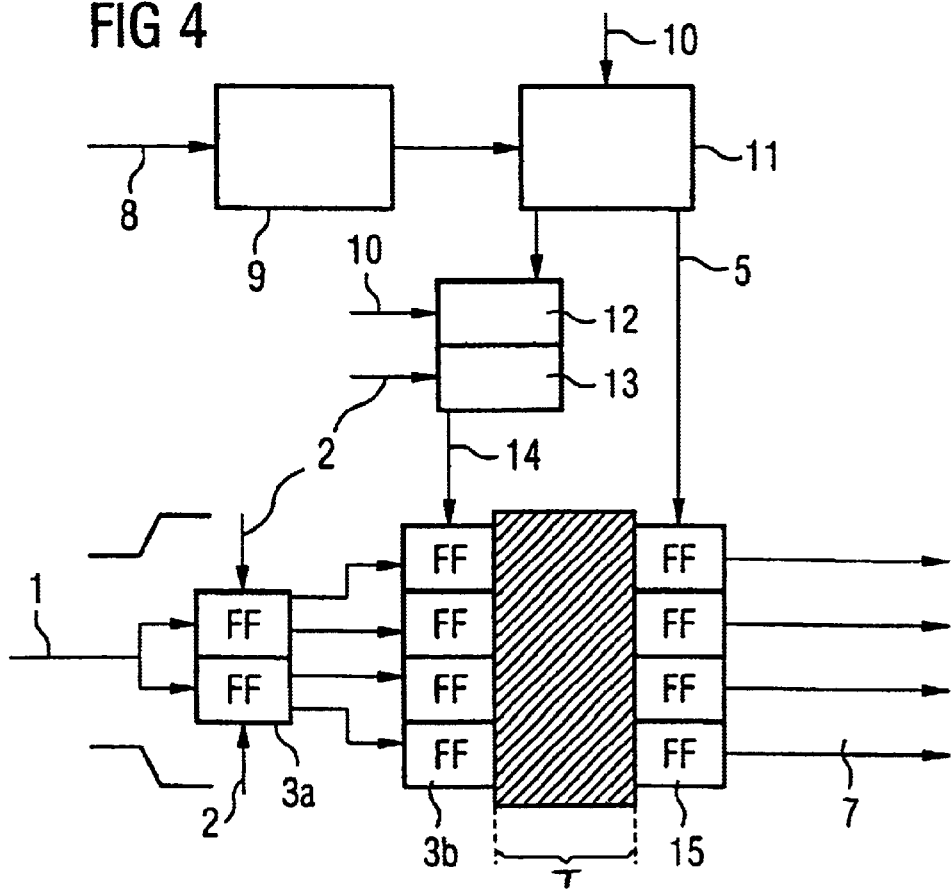
FIG. 4 schematically shows an embodiment of the inventive memory interface.

FIG. 4 shows an embodiment of the inventive DDR memory interface in which there is enough time T remaining/length of the data packet, i.e. the number of data values A, B, C and D, is known (and is 4 in FIG. 4), the end of the data packet can be recognized in advance by counting the system clock pulses. If a data packet has been read in, then the data value in the buffer store 3b can be output. To ensure that reading-in has actually been ended and that all the values in the data packet are held in the registers 3b, the values are released synchronously with the data clock 2. To this end, the counter 12 is connected to a clock synchronization device 13. This clock synchronization device 13 has the data clock pulse 2 applied to it permanently. However, only when the result from counter 12, indicating the end of a data packet, is available does the clock synchronization device 13 forward a data clock pulse as a masked data clock pules 14 to the buffer store 3b. The buffer store 3b thus outputs the register content at its outputs (not shown), where it is copied by an interface memory 15.

The data coming via the line 1 are read into a first register on a rising edge of the data clock signal 2 and are read into a second register on a falling edge of the data clock signal 2. The two registers are combined to form a buffer store 3a. When the value A or B has been read into a respective register on the first rising edge and the first falling edge, the next rising edge and the next falling edge involve the respective value in the two registers of buffer store 3a being copied to a downstream register, and the value in the registers of buffer store 3a is overwritten by the subsequent data C and D in the same data packet. On a further edge of the data clock signal 2, these two values C and D are also written to a downstream register, so that the buffer store 3a is thus followed by a further buffer store 3b containing four registers. The registers in the buffer store 3a and 3b are respectively denoted by "FF" (flip flop). The buffer store 3a and the buffer store 3b together form the data read-in device 3.

The reading-in of the data is triggered by a write instruction which is applied on an instruction line 8. The write instruction is captured and evaluated in an instruction decoder 9 in the memory. At the same time, a system clock signal 10 is applied to the memory interface. The system clock signal 10 is captured by a signal generator 11 which uses the write instruction 8 and the system clock 10 to form an internal write clock which corresponds to the signal on line 5 in FIG. 1. In addition, the signal generator 11 uses the write instruction 8 and the system clock 10 to produce a further signal, which is used to activate a counter 12 which counts the pulses of the system clock. Since the length of the data packet, i.e. the number of data values A, B, C and D, is known (and is 4 in FIG. 4), the end of the data packet can be recognized in advance by counting the system clock pulses. If a data packet has been read in, then the data value in the buffer store 3b can be output. To ensure that reading-in has actually been ended and that all the values in the data packet are held in the registers 3b, the values are released synchronously with the data clock 2. To this end, the counter 12 is connected to a clock synchronization device 13. This clock synchronization device 13 has the data clock pulse 2 applied to it permanently. However, only when the result from counter 12, indicating the end of a data packet, is available does the clock synchronization device 13 forward a data clock pulse as a masked data clock pulse 14 to the buffer store 3b. The buffer store 3b thus outputs the register content at its outputs (not shown), where it is copied by an interface memory 15.

Following the copy operation, the content of the interface memory 15 is output to the internal parallel bus 7 synchronously with the instruction clock 5.

In other words, the counter 12 and the clock synchronization device 13 together produce a time window T in which copying of the content of the buffer store 3b by the interface memory 15 is inhibited.

Preferably, with a data-packet length of four bits, the counter 12 is a one-bit counter whose output state changes just once from a first to a second output state between reading-in of the first data value A and of the last data value D. Thus, the output of the counter 12 at the end of the data packet, for example, is at one, following its being at zero at the start of reading-in. If a data clock signal 2 is then applied, the clock synchronization device 13 forwards the next data signal 2, and the copy operation with subsequent, independent output of the data to the internal bus 7 is triggered.

With this design for the memory interface, a great deal of temporal independence between reading-in and internal output of the data has been achieved, and hence greater tolerance when resynchronizing the data.

This is explained below with reference to FIG. 5.

FIG. 5 shows two successive data packets A, B, C, D, A, B, C and D on the data line 1. Simultaneously with the data, the data clock 2 is applied, which is shown above. The data are read into the buffer store 3, more precisely into the register 3b, as shown in FIG. 4. The first data packet is then ready for memory-internal forwarding; it needs to be copied before it is overwritten.

The situation in which a copy instruction comes very early is shown on the left in the bottom half of FIG. 5; the situation in which a copy instruction comes very late is shown on the right. With a fixed data packet length of four data values, the next pulse can come no earlier than after two clock cycles. This increases the possible range of fluctuation of the copy instruction 14 with respect to the data clock 2 to two for a data-packet length of four and a "prefetch" of four as well.

| Reference numerals |
| --- |
| 1 Serial data input line |
| 2 Data clock line DQS |
| 3 Data read-in device, 3a first buffer store, 3b second buffer store |
| 4 Internal data line for transferring DQS-synchronized data |
| 5 Instruction clock line WRCLK |
| 6 Resynchronization device DQS/WRCLK |
| 7 Internal parallel data bus |
| 8 Instruction line |
| 9 Instruction decoder |
| 10 System clock line |
| 11 Signal generator |
| 12 Counter |
| 13 Clock synchronization device |
| 14 Masked data clock pulse, sync DQS |
| 15 Interface memory |

What is claimed is:

1. A DDR memory having a plurality of memory cells which each have a prescribed word length, which comprises:

(a) a first clock signal input for receiving a system clock signal;

(b) a second clock signal input for receiving a data clock signal;

(c) an instruction input for reading in and decoding a write instruction which is synchronized with the system clock signal;

(d) a serial data input for reading in serial data on a rising edge and on a falling edge of the data clock signal; and (e) a serial-parallel converter for putting together a prescribed number of data items from the data read in to give a prescribed number of words from data words having a prescribed word length, wherein an interface memory which copies the at least one data word from the serial-parallel converter when it receives a copy signal which is synchronous with the data clock signal, and which outputs the at least one data word to a bus when it receives an output signal which is synchronous with the system clock signal.

2. The DDR memory as claimed in claim 1, comprising a device for producing a time window in which production of the copy signal by the data clock is inhibited.

3. The DDR memory as claimed in claim 2, wherein the device for producing a time window comprises a counter, whose output state changes once from a first to a second output state between the reading-in of a first data value and of a last data value for the at least one data word, and a clock synchronization device which outputs the copy signal when a data clock signal is applied and the counter has the second output state.

4. A storage method for storing data in a DDR memory having a plurality of memory cells which each have a prescribed word length, which comprises the following steps:

(a) receiving a system clock signal in a first clock signal input;

(b) receiving a data clock signal in a second clock signal input;

(c) reading in and decoding a write instruction in an instruction input;

(d) synchronizing the write instruction with the system clock signal;

(e) reading in serial data on a rising edge and on a falling edge of the data clock signal with a serial data input; and (f) putting together a prescribed number of data items from the data read in to give a prescribed number of words from data words having the prescribed word length with a serial parallel converter, wherein an interface memory copying the at least one data word from the serial-parallel converter upon receipt of a copy signal which is synchronized with the data clock signal and outputting the at least one data word to a bus upon receipt of an output signal which is synchronous with the system clock signal.

5. The method as claimed in claim 4, wherein producing a time window in which production of the copy signal by the data clock is inhibited by a device.

* * * * *